(12) United States Patent
Seon

(10) Patent No.: US 12,489,245 B2
(45) Date of Patent: Dec. 2, 2025

(54) ELECTRICAL CONNECTION STRUCTURE USING MAGNETIC ATTRACTION

(71) Applicant: LG Energy Solution, Ltd., Seoul (KR)

(72) Inventor: Sang Ok Seon, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 146 days.

(21) Appl. No.: 18/031,086

(22) PCT Filed: Dec. 8, 2021

(86) PCT No.: PCT/KR2021/018553
§ 371 (c)(1),
(2) Date: Apr. 10, 2023

(87) PCT Pub. No.: WO2022/149743
PCT Pub. Date: Jul. 14, 2022

(65) Prior Publication Data
US 2023/0378687 A1    Nov. 23, 2023

(30) Foreign Application Priority Data

Jan. 5, 2021 (KR) .................. 10-2021-0001128

(51) Int. Cl.
*H01R 13/62* (2006.01)
*H01R 12/77* (2011.01)
(Continued)

(52) U.S. Cl.
CPC ....... *H01R 13/6205* (2013.01); *H01R 12/771* (2013.01); *H01R 12/79* (2013.01); *H05K 1/117* (2013.01); *H05K 2201/08* (2013.01)

(58) Field of Classification Search
None
See application file for complete search history.

(56) References Cited

U.S. PATENT DOCUMENTS 3,245,024 A * 4/1966 Evans .................. H01R 13/113
439/468
3,786,391 A * 1/1974 Mathauser ......... H01R 13/6205
439/246
(Continued)

FOREIGN PATENT DOCUMENTS

CN    211404884 U    9/2020
JP    H01128586 A    5/1989
(Continued)

OTHER PUBLICATIONS

Original and Translation of JP3817815 (Year: 2006).*
(Continued)

*Primary Examiner* — Timothy J. Dole
*Assistant Examiner* — Muhammed Azam
(74) *Attorney, Agent, or Firm* — Lerner David LLP

(57) ABSTRACT

A connection structure includes: a first connection part provided on a surface of a first member, the first member including at least one conductor pattern; and a second connection part provided on a surface of a second member, the second member having at least one conductive pad formed on a surface thereof and configured to be coupled to a surface of the first connection part by a magnetic force so that at least one conductor pattern and at least one conductive pad are electrically connected to each other.

14 Claims, 4 Drawing Sheets

(51) Int. Cl.
  *H01R 12/79* (2011.01)
  *H05K 1/11* (2006.01)

(56) References Cited

U.S. PATENT DOCUMENTS

| | | | | |
|---|---|---|---|---|
| 4,713,014 A * | 12/1987 | Conroy-Wass | ......... | G01R 1/04 |
| | | | | 439/260 |
| 4,737,112 A * | 4/1988 | Jin | ......... | H01R 13/03 |
| | | | | 439/91 |
| 4,960,614 A * | 10/1990 | Durand | ......... | H01F 41/16 |
| | | | | 427/511 |
| 5,036,128 A * | 7/1991 | Durand | ......... | H05K 1/095 |
| | | | | 428/323 |
| 5,247,248 A * | 9/1993 | Fukunaga | ......... | G01R 31/2863 |
| | | | | 324/750.25 |
| 5,385,478 A * | 1/1995 | Niekawa | ......... | H01R 12/79 |
| | | | | 439/495 |
| 5,795,162 A * | 8/1998 | Lambert | ......... | H05K 3/325 |
| | | | | 333/260 |
| 5,909,100 A * | 6/1999 | Watanabe | ......... | B60L 53/126 |
| | | | | 320/108 |
| 6,030,229 A | 2/2000 | Tsutsui | | |
| 6,049,656 A * | 4/2000 | Kim | ......... | B23K 1/005 |
| | | | | 228/180.1 |
| 6,315,616 B1 * | 11/2001 | Hayashi | ......... | H01R 12/79 |
| | | | | 439/108 |
| 6,509,647 B2 * | 1/2003 | Akram | ......... | H01L 23/13 |
| | | | | 257/781 |
| 6,528,873 B1 * | 3/2003 | Heinen | ......... | H01L 24/11 |
| | | | | 257/772 |
| 7,182,604 B2 * | 2/2007 | Ehr | ......... | A61N 1/048 |
| | | | | 439/38 |
| 7,252,512 B2 * | 8/2007 | Tai | ......... | H01R 13/6205 |
| | | | | 439/39 |
| 7,331,793 B2 * | 2/2008 | Hernandez | ......... | H01F 38/14 |
| | | | | 439/38 |
| 7,344,380 B2 * | 3/2008 | Neidlein | ......... | H01R 13/6205 |
| | | | | 439/378 |
| 7,611,357 B2 * | 11/2009 | Han | ......... | H05K 1/0286 |
| | | | | 439/700 |
| 8,185,084 B2 * | 5/2012 | Terlizzi | ......... | H04R 1/1041 |
| | | | | 455/343.5 |
| 8,758,025 B1 * | 6/2014 | Liljegren | ......... | H01R 13/6205 |
| | | | | 439/39 |
| 9,048,570 B2 * | 6/2015 | Goel | ......... | H02J 7/0032 |
| 9,130,291 B2 * | 9/2015 | Poh | ......... | H01R 13/6205 |
| 9,442,339 B2 * | 9/2016 | Parker | ......... | G02F 1/163 |
| 9,614,321 B2 * | 4/2017 | Nakamura | ......... | H01R 13/6205 |
| 9,787,022 B2 * | 10/2017 | Wilcox | ......... | H01R 13/6658 |
| 9,967,646 B2 * | 5/2018 | Hankey | ......... | H04R 1/1025 |
| 10,014,624 B2 * | 7/2018 | Chun | ......... | H01R 13/6205 |
| 10,381,760 B2 * | 8/2019 | Raynor | ......... | H01R 12/721 |
| 10,396,494 B2 * | 8/2019 | Little | ......... | H01R 12/7023 |
| 10,594,074 B1 * | 3/2020 | Zhao | ......... | H01R 13/6205 |
| 10,944,226 B2 * | 3/2021 | Justin | ......... | H01R 31/06 |
| 10,998,672 B2 * | 5/2021 | Weis | ......... | H05K 3/365 |
| 11,121,502 B2 * | 9/2021 | Kasar | ......... | H01R 13/6658 |
| 11,227,853 B2 * | 1/2022 | Israel | ......... | H10H 20/857 |
| 11,264,146 B2 * | 3/2022 | Oh | ......... | H01B 7/10 |
| 11,825,613 B2 * | 11/2023 | Park | ......... | H05K 1/189 |
| 11,864,328 B2 * | 1/2024 | Jang | ......... | H05K 3/361 |
| 11,881,344 B2 * | 1/2024 | Xiong | ......... | H01F 17/04 |
| 12,108,520 B2 * | 10/2024 | Yoshida | ......... | H05K 1/181 |
| 12,308,564 B2 * | 5/2025 | Seon | ......... | H01F 7/04 |
| 2004/0209489 A1 * | 10/2004 | Clapper | ......... | H01R 13/6205 |
| | | | | 439/39 |
| 2005/0239261 A1 * | 10/2005 | Tai | ......... | H05K 3/365 |
| | | | | 438/380 |
| 2007/0254510 A1 * | 11/2007 | DeBey | ......... | H01R 13/6205 |
| | | | | 439/188 |
| 2009/0061175 A1 * | 3/2009 | Kim | ......... | C25D 5/007 |
| | | | | 428/209 |
| 2013/0273752 A1 * | 10/2013 | Rudisill | ......... | H01R 13/6205 |
| | | | | 439/39 |
| 2014/0170864 A1 | 6/2014 | Hwang | | |
| 2015/0031220 A1 * | 1/2015 | Fang | ......... | H01R 13/6205 |
| | | | | 439/38 |
| 2015/0094713 A1 * | 4/2015 | Pham | ......... | H01R 13/64 |
| | | | | 606/41 |
| 2015/0194764 A1 * | 7/2015 | Magana | ......... | H01R 13/642 |
| | | | | 439/39 |
| 2016/0226183 A1 * | 8/2016 | Szeto | ......... | H01R 24/66 |
| 2019/0269007 A1 * | 8/2019 | Sikina | ......... | H05K 1/0242 |
| 2021/0059043 A1 | 2/2021 | Sikina et al. | | |
| 2022/0181049 A1 * | 6/2022 | Ahn | ......... | H01B 7/0208 |
| 2023/0084832 A1 * | 3/2023 | Seon | ......... | H01F 7/0252 |
| | | | | 439/39 |
| 2023/0344167 A1 * | 10/2023 | Seon | ......... | H01R 13/6205 |
| 2023/0378687 A1 * | 11/2023 | Seon | ......... | H05K 1/117 |
| 2024/0322485 A1 * | 9/2024 | Lee | ......... | H01R 13/2407 |

FOREIGN PATENT DOCUMENTS

| | | |
|---|---|---|
| JP | H04282582 A | 10/1992 |
| JP | H05217640 A | 8/1993 |
| JP | 2004296426 A | 10/2004 |
| JP | 2008235073 A | 10/2008 |
| JP | 2009259411 A | 11/2009 |
| KR | 20160061013 A | 5/2016 |
| KR | 20170041065 A | 4/2017 |
| KR | 20170077604 A | 7/2017 |
| KR | 101805446 B1 | 12/2017 |
| KR | 101945250 B1 | 2/2019 |
| KR | 20200015178 A | 2/2020 |
| KR | 102099966 B1 | 4/2020 |
| KR | 20200042570 A | 4/2020 |
| KR | 20200063809 A | 6/2020 |
| KR | 20200117165 A | 10/2020 |
| KR | 20210001285 A | 1/2021 |
| WO | 2019168992 A1 | 9/2019 |

OTHER PUBLICATIONS

Extended European Search Report including Written Opinion for Application No. 21917905.8 dated Feb. 13, 2024, pp. 1-9.

International Search Report for Application No. PCT/KR2021/018553 mailed Mar. 10, 2022, 2 pages.

Communication pursuant to Article 94(3) EPC for European Application No. 21917905.8, dated Jun. 4, 2025, 6 pages.

* cited by examiner (a)

(b)

ELECTRICAL CONNECTION STRUCTURE USING MAGNETIC ATTRACTION

CROSS-REFERENCE TO RELATED APPLICATIONS

This application is a national phase entry under 35 U.S.C. § 371 of International Application No. PCT/KR2021/018553, filed on Dec. 8, 2021, which claims priority to and the benefit of Korean Patent Application No. 10-2021-0001128 filed in the Korean Intellectual Property Office on Jan. 5, 2021, the entire contents of which are incorporated herein by reference.

TECHNICAL FIELD

Embodiments disclosed in the present disclosure relate to a connection structure of a connector.

BACKGROUND ART

In general, a component, called a connector, is used to connect a plurality of conductive wires or devices through which an electric current flows. The factors, which are associated with connection and disconnection between two connection terminals, are considered important in the connector. In particular, one of the important factors is to reduce costs by simplifying a connecting structure.

Examples of the connectors representatively include a wire type connector, FFC (flexible flat cable) type connector, and the like. In general, the connector includes therein an injection-molded product configured to constitute a housing, and a mounting structure on which a connector terminal and a PCB (printed circuit board) are mounted. Since the connector has several complicated components to securely couple the two connection terminals as described above, there is a need to minimize the components.

DISCLOSURE

Technical Problem

An object of embodiments disclosed in the present disclosure is to provide a connection structure configured by using a member having magnetism, such as a ferromagnetic element, to reduce costs required to manufacture a connector and make it easy to connect or disconnect two connection terminals of the connector.

Technical problems of the embodiments disclosed in the present disclosure are not limited to the aforementioned technical problems, and other technical problems, which are not mentioned above, may be clearly understood by those skilled in the art from the following descriptions.

Technical Solution

A connection structure according to an embodiment disclosed in the present disclosure includes: a first connection part provided on one surface of a first member including at least one conductor pattern; and a second connection part provided on the other surface of a second member having at least one conductive pad formed on one surface thereof, the second connection part being configured to be connected to one surface of the first connection part by means of a magnetic force so that at least one conductor pattern and at least one conductive pad are electrically connected to each other.

According to the embodiment, the first connection part may include a ferromagnetic element, and the second connection part may include a steel plate.

According to the embodiment, the first member may include a first guide part, the second member may include a second guide part, the first and second guide parts may be aligned with each other as the first and second members are coupled to each other.

According to the embodiment, the first guide part may include a guide block, the second guide part may include a guide groove, the first and second members may be aligned with each other as the first and second guide parts are coupled to each other.

According to the embodiment, the first and second connection parts may have a plurality of blocks configured to correspond to one another in a one-to-one manner.

According to the embodiment, when at least one of the first and second connection parts includes a magnet, the plurality of blocks may be disposed such that polarities of the adjacent blocks are opposite to each other.

According to the embodiment, the first member may include a film configured to protect the conductor pattern.

According to the embodiment, a portion of the film, where the first member comes into contact with the second member, may be partially removed.

According to the embodiment, when a magnetic force between the first and second connection parts is equal to or higher than a reference value, at least one of the first and second connection parts may be attachable or detachable by a jig having a polarity opposite to a polarity of at least one of the first and second connection parts.

According to the embodiment, the second member may have a structure in which the conductive pad and an IC circuit are provided on a printed circuit board (PCB).

Advantageous Effects

The connection structure according to the embodiment disclosed in the present disclosure is configured by using the member having magnetism, such as a ferromagnetic element, to reduce costs required to manufacture the connector and make it easy to connect or disconnect the two connection terminals of the connector.

MODE FOR INVENTION

Figure 1:
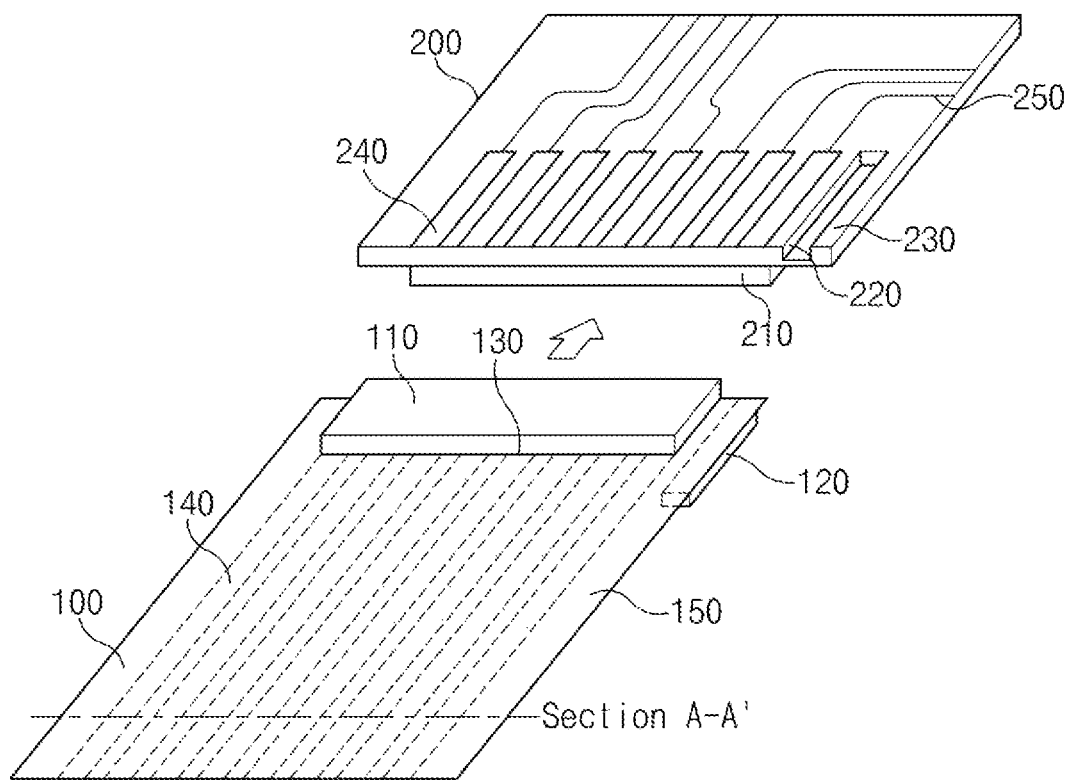
FIG. 1 is a view illustrating components configured to implement a connection structure according to an embodiment disclosed in the present disclosure.

Hereinafter, various embodiments disclosed in the present disclosure will be described in detail with reference to the accompanying drawings. In the drawings of the present disclosure, the same constituent elements will be designated by the same reference numerals, and the repetitive description of the same constituent elements will be omitted.

Specific structural or functional descriptions of various embodiments disclosed in the present disclosure are exemplified only for the purpose of explaining the embodiments, the embodiments disclosed in the present disclosure may be carried out in various forms, and it should not be interpreted that the present disclosure is limited to the embodiments described in the present disclosure.

The terms "first" and "second" used in various embodiments may be used regardless of the order and/or importance of various constituent elements and do not limit the corresponding constituent elements. For example, a first constituent element may be named a second constituent element, and similarly, the second constituent element may also be named the first constituent element, without departing from the scope of the embodiment disclosed in the present disclosure.

The terms used in the present disclosure are used to just describe a specific embodiment and do not intend to limit the scope of another embodiment. Singular expressions may include plural expressions unless clearly described as different meanings in the context.

All terms used herein, including technical or scientific terms, may have the same meaning as commonly understood by those skilled in the art to which the embodiments disclosed in the present disclosure pertain. The terms such as those defined in a commonly used dictionary may be interpreted as having meanings identical or similar to meanings in the context of related technologies and should not be interpreted as ideal or excessively formal meanings unless explicitly defined in the present disclosure. In some instances, the terms defined in the present disclosure should not be interpreted to exclude the embodiments disclosed in the present disclosure.

FIG. 1 is a view illustrating components configured to implement a connection structure according to an embodiment disclosed in the present disclosure.

FIG. 1 illustrates a connector including the connection structure according to the embodiment disclosed in the present disclosure. The connector illustrated in FIG. 1 may have a structure in which a first member 100 and a second member 200 are connected to each other. That is, the connector illustrated in FIG. 1 may have the structure in which the first member 100 and the second member 200 are coupled to each other such that the first member 100 is positioned at an upper end and the second member 200 is positioned at a lower end. For example, the connection structure illustrated in FIG. 1 may be applied to an FFC type connector.

In this case, the first member 100 may include a first connection part 110, a first guide part (guide block) 120, a bonding part 130, a conductor pattern 140, and an insulation film 150. In addition, the second member 200 may include a second connection part 210, a second guide part (guide groove) 220, a PCB 230, a conductive pad 240, and an IC circuit 250.

The first connection part 110 of the first member 100 may interact with the second connection part 210 of the second member 200 to couple the first member 100 and the second member 200. In this case, as illustrated in FIG. 1, the first connection part 110 may be provided on one surface (e.g., an upper end) of the first member 100, and the second connection part 210 may be provided on the other surface (e.g., a lower end) of the second member 200. However, the positions of the first and second connection parts 110 and 210 are not limited to the positions illustrated in FIG. 1. The first connection part 110 may be positioned at any point on the first member 100, and the second connection part 210 may be positioned at any point on the second member 200.

At least one of the first and second connection parts 110 and 210 may include an object having magnetism. For example, the first connection part 110 may include a ferromagnetic element (e.g., neodymium), and the second connection part 210 may include a steel plate. Therefore, the conductor pattern 140 of the first member 100 and the conductive pad 240 of the second member 200 may be electrically connected to each other by a magnetic force between the first and second connection parts 110 and 210.

The first guide part 120 of the first member 100 and the second guide part 220 of the second member 200 may be aligned with each other when the first and second members 100 and 200 are coupled. In this case, as illustrated in FIG. 1, the first guide part 120 may be a guide block protruding from the other surface of the first member 100, and the second guide part 220 may be a guide groove formed in one surface of the second member 200 so that the first guide part 120 may be inserted into the guide groove.

As described above, the first and second members 100 and 200 may be aligned with each other as the first guide part 120 provided on the first member 100 is coupled to the second guide part 220 provided on the second member 200. However, the shapes of the first and second guide parts 120 and 220 are not limited to the shapes illustrated in FIG. 1. The first and second guide parts 120 and 220 may have various shapes in addition to the shapes illustrated in FIG. 1.

The bonding part 130 may attach the first connection part 110 to the first member 100. In this case, as described above, the bonding part 130 may attach the first connection part 110 to the first member 100 such that the first member 100 and the first connection part 110 are attachable to and detachable from each other so that the first connection part 110 may be removed by a jig. For example, the bonding part 130 is configured as a magnet. One surface of the bonding part 130 may be attached to the first member 100 by a bonding agent (not illustrated), and the other surface of the bonding part 130 may be attached to the first connection part 110 by the magnetic force.

The conductor pattern 140 may be made of a conductive material and perform a function of transmitting an electrical signal from a device connected to the first member 100. As illustrated in FIG. 1, the conductor pattern 140 may have a shape including a plurality of conductive wires arranged side by side in the first member 100.

The insulation film 150 may serve to insulate the conductor patterns 140 included in the first member 100 and protect the conductor patterns 140 from the outside. In this case, the conductor pattern 140 may have a structure laminated between the two insulation films 150 by a bonding agent (not illustrated). In this case, a portion of the insulation film 150, where the conductor pattern 140 comes into contact with the second member 200, may be removed so that the conductor pattern 140 is electrically connected to the conductive pad 240 of the second member 200.

The PCB 230 provided on the second member 200 may include the conductive pad 240 and the IC circuit 250. The conductive pad 240 is made of a conductive material, such that the conductive pad 240 may receive an electrical signal from the conductor pattern 140 of the first member 100 and transmit the electrical signal to the conductor pattern 140 from a device connected to the second member 200. In addition, the electrical signal received through the conductive pad 240 may be transmitted through the IC circuit 250 to the device connected to the second member 200.

As described above, the connection structure according to the embodiment disclosed in the present disclosure is configured by using the member having magnetism, such as a ferromagnetic element, to reduce costs required to manufacture the connector and make it easy to connect or disconnect the two connection terminals of the connector.

Figure 2:
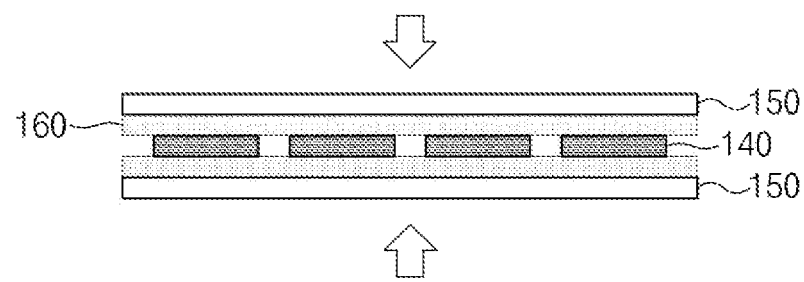
FIG. 2 is a view illustrating a structure of a member including a connection part for implementing the connection structure according to the embodiment disclosed in the present disclosure.
Figure 2:
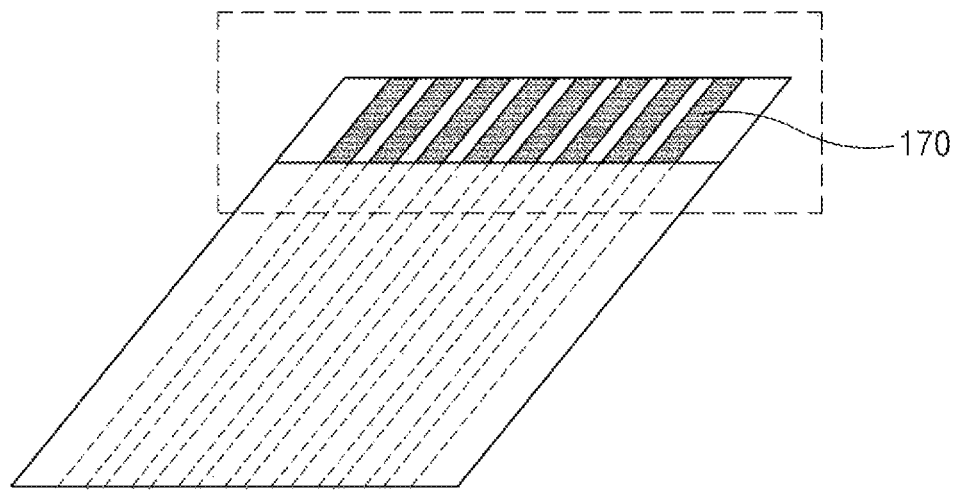

FIG. 2 is a view illustrating a structure of the member including the connection part for implementing the connection structure according to the embodiment disclosed in the present disclosure.

FIG. 2A is a cross-sectional view taken along line A-A' in FIG. 1. In this case, as illustrated in FIG. 1, the conductor pattern 140 of the first member 100 may have the shape including the plurality of conductive wires. In addition, the conductor pattern 140 may be attached to the insulation films 150 by the bonding agent 160. As illustrated in FIG. 2A, the conductor pattern 140 may have the structure laminated between the two insulation films 150.

FIG. 2B illustrates a portion 170 where a part of the insulation film 150 of the first member 100 is removed. The portion of the insulation film 150, where the conductor pattern 140 of the first member 100 comes into contact with the conductive pad 240 of the second member 200, is removed so that the conductor pattern 140 of the first member 100 comes into contact with the conductive pad 240 of the second member 200.

That is, referring to FIG. 1, the portion of the insulation film 150 provided on the other surface of the first member 100, which corresponds to a region of one surface of the second member 200 in which the conductive pad 240 is provided, is removed, such that the conductor pattern 140 of the first member 100 and the conductive pad 240 of the second member 200 may come into physical/electric contact with each other.

Figure 3:
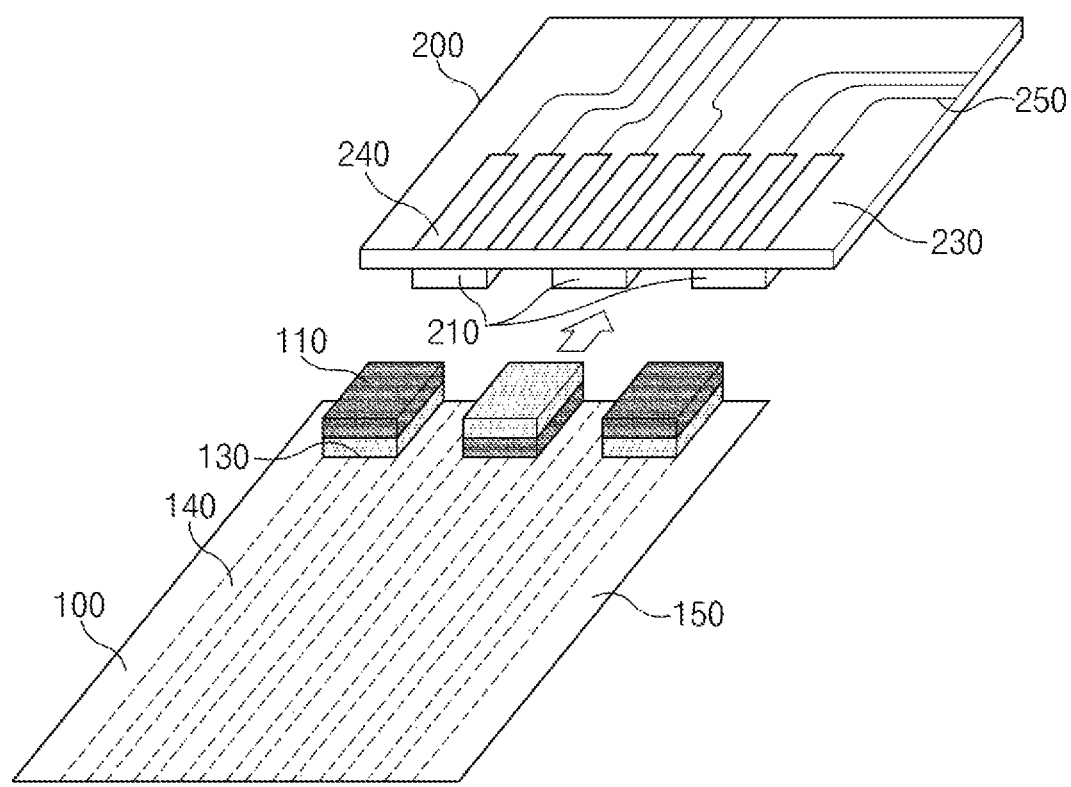
FIG. 3 is a view illustrating components configured to implement a connection structure according to another embodiment disclosed in the present disclosure.

FIG. 3 is a view illustrating components configured to implement a connection structure according to another embodiment disclosed in the present disclosure. Like the connector illustrated in FIG. 1, the connector illustrated in FIG. 3 may also have the structure in which the first and second members 100 and 200 are connected to each other. That is, the connector may have the structure in which the first member 100 and the second member 200 are coupled to each other such that the first member 100 is positioned at the upper end and the second member 200 is positioned at the lower end.

Even in this case, the first member 100 may include the first connection part 110, the bonding part 130, the conductor pattern 140, and the insulation film 150. In addition, the second member 200 may include the second connection part 210, the PCB 230, the conductive pad 240, and the IC circuit 250. In this case, because the first connection part 110, the bonding part 130, the conductor pattern 140, and the insulation film 150 of the first member 100 and the second connection part 210, the PCB 230, the conductive pad 240, and the IC circuit 250 of the second member 200 are substantially identical to those illustrated in FIG. 1, a detailed description thereof will be omitted in FIG. 3. In addition, FIG. 3 does not illustrate the first and second guide parts 120 and 220 for convenience, but the first and second guide parts 120 and 220 may also be included, as necessary.

There is a difference in that the first connection part 110 of the first member 100 and the second connection part 210 of the second member 200 are provided in the form of a plurality of blocks as illustrated in FIG. 3 instead of being integrated as illustrated in FIG. 1. In this case, the blocks of the first and second connection parts 110 and 210 may be disposed to correspond to one another in a one-to-one manner.

In addition, when at least one of the first and second connection parts 110 and 210 includes a magnet, the plurality of blocks may be disposed so that polarities of two adjacent blocks are opposite to each other. For example, when the first connection part 110 is a ferromagnetic element, the blocks may be repeatedly disposed so that the polarities of the adjacent blocks are opposite to each other, as illustrated in FIG. 3. As described below, this is to easily release the magnet of the first connection part 110 by means of the jig by blocking an external magnetic force by forming a closed circuit of a magnetic field formed by the first connection part 110.

Figure 4:
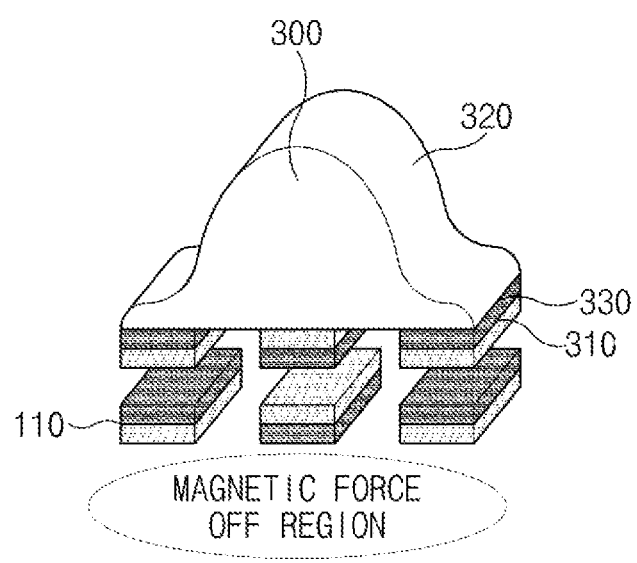
FIG. 4 is a view illustrating a jig configured to attach or detach the connection part of the connection structure according to another embodiment disclosed in the present disclosure.

FIG. 4 is a view illustrating a jig configured to attach or detach the connection part of the connection structure according to another embodiment disclosed in the present disclosure.

Referring to FIG. 4, a jig 300 according to the embodiment disclosed in the present disclosure may include magnet parts 310, a handle 320, and bonding parts 330. In particular, the jig 300 illustrated in FIG. 4 may attach or detach at least one of the first and second connection parts 110 and 210 by using the magnet part 310 having a polarity opposite to a polarity of at least one of the first and second connection parts 110 and 210 when the magnetic force between the first and second connection parts 110 and 210 is equal to or higher than a reference value (e.g., when it is difficult to directly release the magnet by using a person's effort).

In addition, the configuration in which the first connection part 110 provided on the first member 100 is a ferromagnetic element will be described with reference to FIG. 4. However, the connection structure disclosed in the present disclosure is not limited thereto. The second connection part 210 may be a ferromagnetic element, or both the first and second connection parts 110 and 210 may be ferromagnetic elements.

The magnet parts 310 may be provided to correspond to the plurality of magnet blocks of the first connection part 110 in a one-to-one manner and disposed so that each of the magnet parts 310 has the polarity opposite to the polarity of each of the blocks of the first connection part 110. Therefore, the magnet part 310 may be coupled to the first connection part 110 by the magnetic force. When the magnet part 310 and the first connection part 110, which have the opposite polarities, are connected to each other by the magnetic force, the closed circuit of the magnetic field is formed, and the external magnetic force is blocked, such that the magnetic force between the first member 100 and the first connection part 110 is eliminated (a magnetic force off region in FIG. 4). Therefore, the first connection part 110 may be easily removed from the first member 100 by the jig 300.

The magnet parts 310 may be attached to the handle 320, and the handle 320 may be formed to be grasped by a user. Therefore, the user may hold the handle 320 and bring the magnet part 310 of the jig 300 into contact with the first connection part 110 of the first member 100 of the connector. Therefore, the user may easily remove the first connection part 110 from the first member 100 even when the user cannot directly release the first connection part 110 because of the high magnetic force between the first and second connection parts 110 and 210.

The bonding part 330 may attach the magnet part 310 to a lower end of the handle 320 of the jig 300. In this case, the bonding part 330 may have a sufficient bonding force that enables the first connection part 110 to be detached from the first member 100.

As described above, the connection structure according to the embodiment disclosed in the present disclosure is configured by using the member having magnetism, such as a ferromagnetic element, to reduce costs required to manufacture the connector and make it easy to connect or disconnect the two connection terminals of the connector.

All the constituent elements, which constitute the embodiment disclosed in the present disclosure described above, may be integrally coupled or operate by being combined, but the embodiments disclosed in the present disclosure are not necessarily limited to the embodiment. That is, one or more of the constituent elements may be selectively combined and operated within the object of the embodiments disclosed in the present disclosure.

In addition, unless explicitly described to the contrary, the words "comprise," "include," or "have" and variations such as "comprises," "comprising," "includes," "including," "has," or "having," should be understood to imply the inclusion of stated elements but not the exclusion of any other elements. Unless otherwise defined, all terms including technical or scientific terms may have the same meaning as commonly understood by those skilled in the art to which the embodiments disclosed in the present disclosure pertain. The terms such as those defined in a commonly used dictionary may be interpreted as having meanings consistent with meanings in the context of related technologies and may not be interpreted as ideal or excessively formal meanings unless explicitly defined in the present disclosure.

The above description is simply given for illustratively describing the technical spirit disclosed in the present embodiment, and those skilled in the art to which the embodiments disclosed in the present disclosure pertain will appreciate that various changes and modifications are possible without departing from the essential characteristics of the embodiments disclosed in the present disclosure. Therefore, the embodiments disclosed in the present disclosure are provided for illustrative purposes only but not intended to limit the technical concept of the embodiments disclosed in the present disclosure. The scope of the technical spirit disclosed in the present disclosure is not limited by the embodiment. The protective scope of the technical spirit disclosed in the present disclosure should be construed based on the appended claims, and all the technical spirit in the equivalent scope thereto should be construed as falling within the scope of the present disclosure.

The invention claimed is:

1. A connection structure comprising:
   a first connection part provided on a first surface of a first member, the first member including at least one conductor pattern on a second surface thereof; and
   a second connection part provided on a first surface of a second member, the second member having at least one conductive pad formed on a second surface thereof opposite the first surface of the second member and configured to be coupled to the second surface of the first connection part by a magnetic force so that the at least one conductor pattern and the at least one conductive pad are electrically connected to each other,
   wherein the first connection part and the second connection part are separated by the first member when the at least one conductor pattern is electrically connected to the at least one conductive pad,
   wherein the first member comprises a first guide part on the second surface of the first member and the second member comprises a second guide part on the second surface of the second member, the first guide part positioned to align with the second guide part when the at least one conductor pattern is electrically connected to the at least one conductive pad,
   wherein the first guide part is a single protrusion protruding from the second surface of the first member, and
   wherein the second guide part is a single recess defined in the second surface of the second member.

2. The connection structure of claim 1, wherein the first connection part comprises a ferromagnetic element, and the second connection part comprises a steel plate.

3. The connection structure of claim 1, wherein the single protrusion is a guide block, the single recess is a guide groove, and the first and second members are aligned with each other as the first and second guide parts are coupled to each other.

4. The connection structure of claim 1, wherein the first and second connection parts have a plurality of blocks configured to correspond to one another in a one-to-one manner.

5. The connection structure of claim 4, wherein when at least one of the first and second connection parts comprises a magnet, the plurality of blocks is disposed such that polarities of adjacent blocks are opposite to each other.

6. The connection structure of claim 1, wherein the first member comprises a film configured to protect the at least one conductor pattern.

7. The connection structure of claim 6, wherein a portion of the film is partially removed where the first member comes into contact with the second member.

8. A system comprising the connection structure of claim 1, wherein when the magnetic force between the first and second connection parts is equal to or higher than a reference value, at least one of the first and second connection parts is attachable or detachable by a jig detached from the first member and the second member, the jig having a polarity opposite to a polarity of at least one of the first and second connection parts.

9. The connection structure of claim 1, wherein the second member has a structure in which the at least one conductive pad and an IC circuit are provided on a printed circuit board (PCB).

10. The connection structure of claim 1, wherein the first surface of the first member faces away from the second member when the at least one conductive member is electrically connected to the at least one conductive pad.

11. The connection structure of claim 1, wherein the second surface of the first member is opposite the first surface of the first member.

12. The connection structure of claim 11, wherein, when the at least one conductor pattern is electrically connected to the at least one conductive pad, the second surface of the first member contacts the second surface of the second member, and the first surface of the first member opposes the first surface of the second member.

13. The connection structure of claim 11, wherein the first guide part is elongate, and wherein the second guide part is elongate.

14. The connection structure of claim 13, wherein, when the at least one conductor pattern is electrically connected to the at least one conductive pad, the first connection part is aligned with the second connection part, and the first and second guide parts are offset from the first and second connection parts.

* * * * *